United States Patent
Tran et al.

(10) Patent No.: US 9,494,987 B2
(45) Date of Patent: Nov. 15, 2016

(54) PROCESSING SYSTEM WITH LOW POWER WAKE-UP PAD

(71) Applicants: Dzung T. Tran, Austin, TX (US); Rishi Bhooshan, Ghaziabad (IN); Rakesh Pandey, Ghaziabad (IN); Fujio Takeda, Austin, TX (US)

(72) Inventors: Dzung T. Tran, Austin, TX (US); Rishi Bhooshan, Ghaziabad (IN); Rakesh Pandey, Ghaziabad (IN); Fujio Takeda, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 360 days.

(21) Appl. No.: 14/093,473

(22) Filed: Nov. 30, 2013

(65) Prior Publication Data

US 2015/0153811 A1    Jun. 4, 2015

(51) Int. Cl.
*G06F 1/26* (2006.01)
*H01L 27/02* (2006.01)
*H01L 29/06* (2006.01)
*G06F 1/32* (2006.01)
*H01L 29/786* (2006.01)

(52) U.S. Cl.
CPC ............. *G06F 1/26* (2013.01); *G06F 1/3206* (2013.01); *G06F 1/3287* (2013.01); *H01L 27/0222* (2013.01); *H01L 29/0611* (2013.01); *H01L 29/78609* (2013.01); *Y02B 60/1282* (2013.01)

(58) Field of Classification Search
CPC .................................................. Y02B 60/1282
See application file for complete search history.

(56) References Cited

U.S. PATENT DOCUMENTS

| | | | |
|---|---|---|---|
| 7,265,605 B1* | 9/2007 | Vasudevan | G05F 1/56 327/534 |
| 7,376,037 B1 | 5/2008 | Law et al. | |
| 8,543,856 B2 | 9/2013 | Singh et al. | |
| 2004/0119526 A1* | 6/2004 | Ajit | H03K 19/00315 327/536 |
| 2006/0220726 A1* | 10/2006 | Ward | H03K 19/0027 327/534 |
| 2011/0169528 A1* | 7/2011 | Verma | G06F 1/10 326/95 |

* cited by examiner

*Primary Examiner* — Thomas Lee
*Assistant Examiner* — Danny Chan

(57) ABSTRACT

An integrated circuit includes an input/output pad, an input circuit, and an output circuit. The input circuit is coupled to the input/output pad that receives input signals including a wake-up signal that indicates when the integrated circuit is to switch from a power-down mode to an active mode. The output circuit is coupled to the input/output pad that provides output signals to the input/output pad. The output circuit includes a first P channel transistor in a well having a drain coupled to the input/output pad, and a source coupled to a power supply terminal. The power supply terminal receives a first power supply voltage during the active mode and is decoupled from any power supply during the power-down mode. The well is coupled to the wake-up signal in response to the wake-up signal indicating a change from the power-down mode to the active mode.

20 Claims, 4 Drawing Sheets

PROCESSING SYSTEM WITH LOW POWER WAKE-UP PAD

BACKGROUND

Field

This invention relates in general to computer processing systems and more specifically to a processing system having a wake-up pad with reduced power requirements.

Description of the Related Art

It is desirable for microprocessor devices to consume as little power as possible. To this end, microcontrollers implement standby or sleep domains which keep part of the device alive in one or more different low power modes, while other components are powered down to avoid consuming any power. A wake-up signal can be sent to the microcontroller to request the controller to come out of a low power mode. To detect the wake-up signal, voltage is supplied to the input/output circuit that samples the wake-up signal. The board regulator supplying the power to the input/output circuit therefore must remain operational even though other components are powered down. The regulator circuit and the input/output circuit associated an input/output pad that receives the wake-up signal continue to consume current even in low power modes.

BRIEF DESCRIPTION OF THE DRAWINGS

The present disclosure may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

The following sets forth a detailed description of various embodiments intended to be illustrative of the invention and should not be taken to be limiting.

Embodiments of systems and methods disclosed herein provide input/output (I/O) circuit that reduces leakage current, and therefore power consumption, of I/O circuit. When a wake-up signal is detected, the well of a P-channel transistor coupled to an output portion of I/O circuit is biased to the voltage of the wake-up signal at the input pad. Biasing the well to the voltage at the input pad prevents leakage current in the P-channel transistor when the device is being awakened from a low power mode. The biased well can help a device remain within overall leakage current specifications, which are becoming ever more stringent as devices become more mobile while providing increasing levels of functionality.

For purposes of discussion, the I/O circuit of the present disclosure is illustrated in the context of a microprocessor system. However, the I/O circuit can be similarly employed in various types of electronic devices, such as application specific integrated circuits (ASICs), microcontrollers, systems-on-a-chip (SOCs), and the like.

Figure 1:
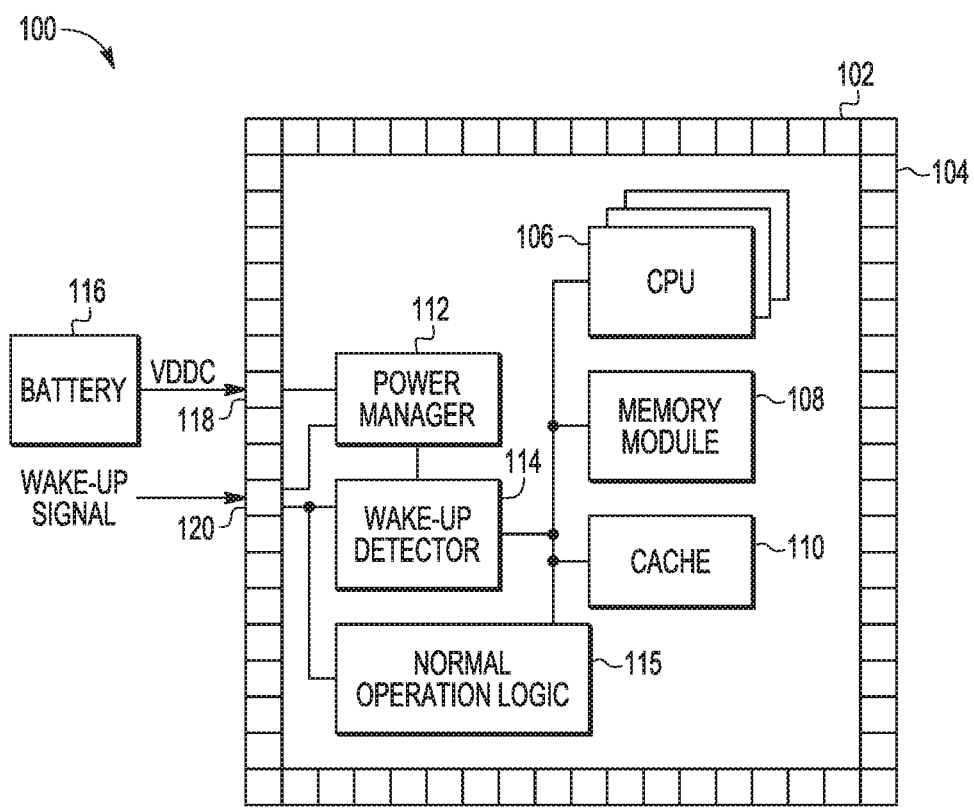
FIG. 1 is a top view of a microprocessor system in accordance with at least one embodiment of the present disclosure.

Referring to FIG. 1, an exemplary microprocessing system 100 (e.g., a microcontroller or system on chip) implementing power management for wake-up I/O pad circuit 120 is illustrated in accordance with at least one embodiment of the present disclosure. In the illustrated example, the system 100 is implemented with integrated circuit on a substrate 102 that includes a ring of input/output circuit 104 including I/O circuit 118 coupled to power manager 112 and I/O circuit 120 coupled to power manager 112 and wake-up detector 114. I/O circuit 104, 118, 120 can be included around one or more edges of the periphery of substrate 102. System 100 further includes a central processing unit (CPU) 106 and a plurality of peripheral components, such as a memory module 108 and one or more levels of cache memory 110. The input/output (I/O) circuit 104, 118, 120 receive signals from, and provide signals to, components external to the system 100 through electrically conductive I/O pads connected to the I/O circuit 104, 118, 120.

At least some of the I/O circuit 104 is connected to a first power domain referred to as a VDD bus and a VSS bus (not shown), but other I/O circuit 104 may be connected to separate power domains that use different voltages. I/O circuit 118 can be connected to a constant power supply such as battery 116, such as a coin cell battery, that is independent of other power domains being used by system 100. The voltage from battery 116 is referred to as VDDC and is supplied to power manager 112 through I/O circuit 118. Power manager 112 manages the various power domains used by components on substrate 102 including providing battery power VDDC to wake-up detector 114 and I/O circuit 120. A wake-up signal is provided to wake-up detector 114 via I/O circuit 120. Wake-up detector 114 is coupled to provide the wake-up signal to CPU 106, memory module 108, and cache memory 110. The wake-up signal can be generated by an external component coupled to system 100.

Normal operation logic 115 is also coupled to I/O circuit 120 to handle signals that are input to system 100 when system 100 is not in a low power mode. Signals input through I/O circuit may be multiplexed and sent to wake-up detector 114 or normal operation logic 115 based on whether system 100 is in a low power mode or not. The output of normal operation logic 115 can also provide a signal to operate the output portion of I/O circuit 120 during normal operation. Normal operation logic 115 can also receive a signal from the input portion of I/O circuit 120 during normal operation.

Figure 2:
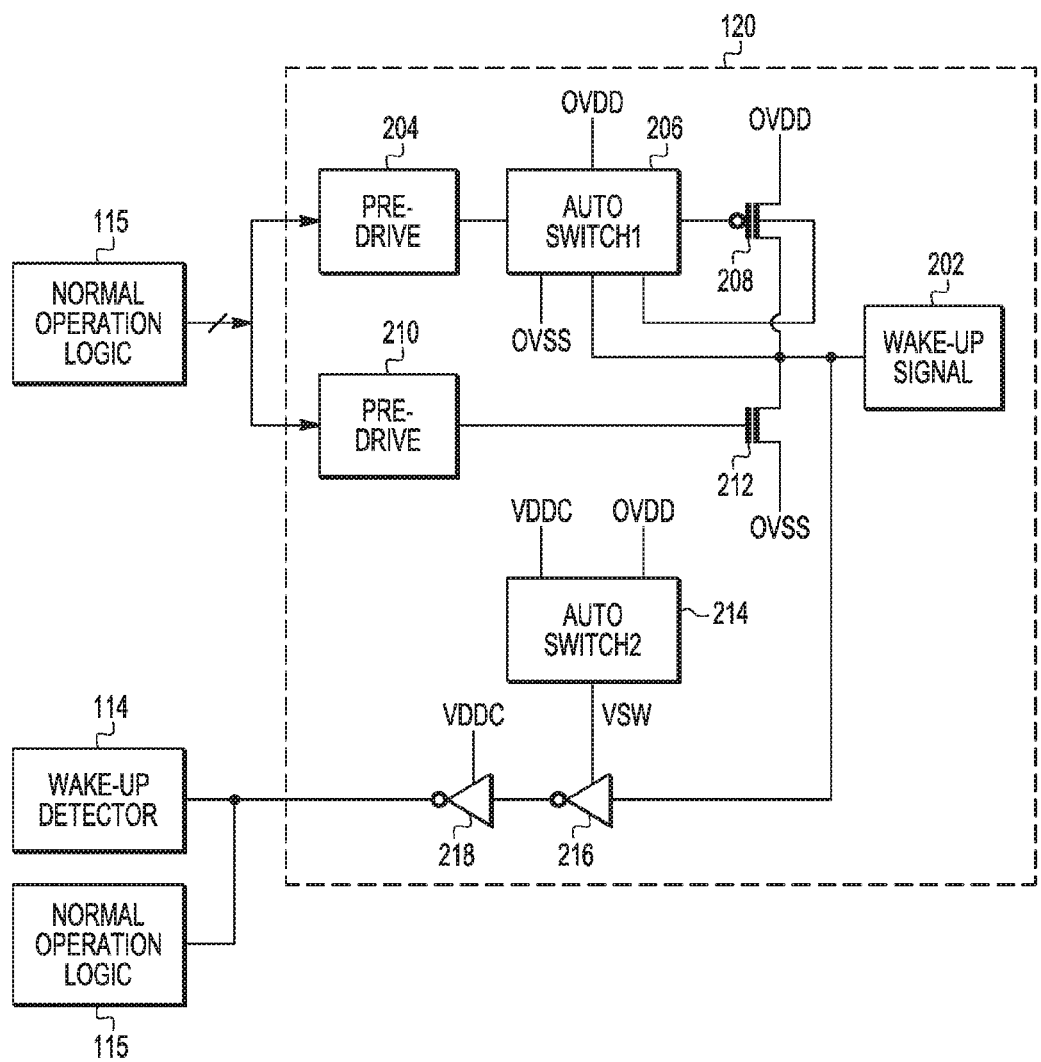
FIG. 2 is a schematic diagram illustrating an embodiment of wake-up input/output circuit that can be used in the microprocessor system of FIG. 1.

FIG. 2 is a schematic diagram illustrating an embodiment of I/O circuit 120 that can be used in the microprocessor system 100 of FIG. 1. An output portion of I/O circuit 120 includes pre-drive circuit 204, auto switch 206, P-channel transistor 208, pre-drive circuit 210 and N-channel transistor 212. An input portion of I/O circuit 120 includes a second auto switch 214, input inverter 216, and level shifting inverter 218.

In the output portion of I/O circuit 120, first pre-drive circuit 204 is coupled to provide a pre-drive signal to a first auto switch 206. First auto switch 206 is configured to receive supply voltage OVDD and to a ground voltage OVSS. The ground voltage OVSS can be zero (0) V or any suitable voltage that is lower than the supply voltage OVDD. A first output of auto switch 206 is coupled to the gate electrode of P-channel transistor 208 and a second output of auto switch 206 is coupled to the N-well of P-channel transistor 208. A source electrode of P-channel transistor 208 is coupled to supply voltage OVDD and a drain electrode of P-channel transistor 208 is coupled to a drain electrode of N-channel transistor 212.

I/O pad 202 is coupled between the drain electrode of P-channel transistor 208 and the drain electrode of N-channel transistor 212, and to auto switch 206.

A second pre-drive circuit 210 provides a second pre-drive signal to a gate electrode of N-channel transistor 212. A source electrode of N-channel transistor 212 is coupled to ground voltage OVSS.

An input signal to pre-drive circuits 204, 210 is provided by normal operation logic 115 to operate pre-drive circuits 204, 210 during normal (or not low power) operating mode(s).

Input inverter 216 receives input from I/O pad 202 and a control input labeled VSW from second auto switch 214. The output of inverter 216 is provided as an input to inverter 218. Battery supply voltage VDDC is provided as a control input to inverter 218. The output of inverter 128 is provided to wake-up detector 114 and normal operation logic 115.

During low power operation, auto switch 206 places P-channel transistor 208 in non-conducting mode and biases the N-well of P-channel transistor 208 to the voltage at I/O pad 202 when the device is being awakened from a low power mode. During normal operation, auto switch 206 places P-channel transistor 208 in conducting mode and allows P-channel transistor 208 to operate without a bias on the N-well of P-channel transistor 208.

Figure 3:
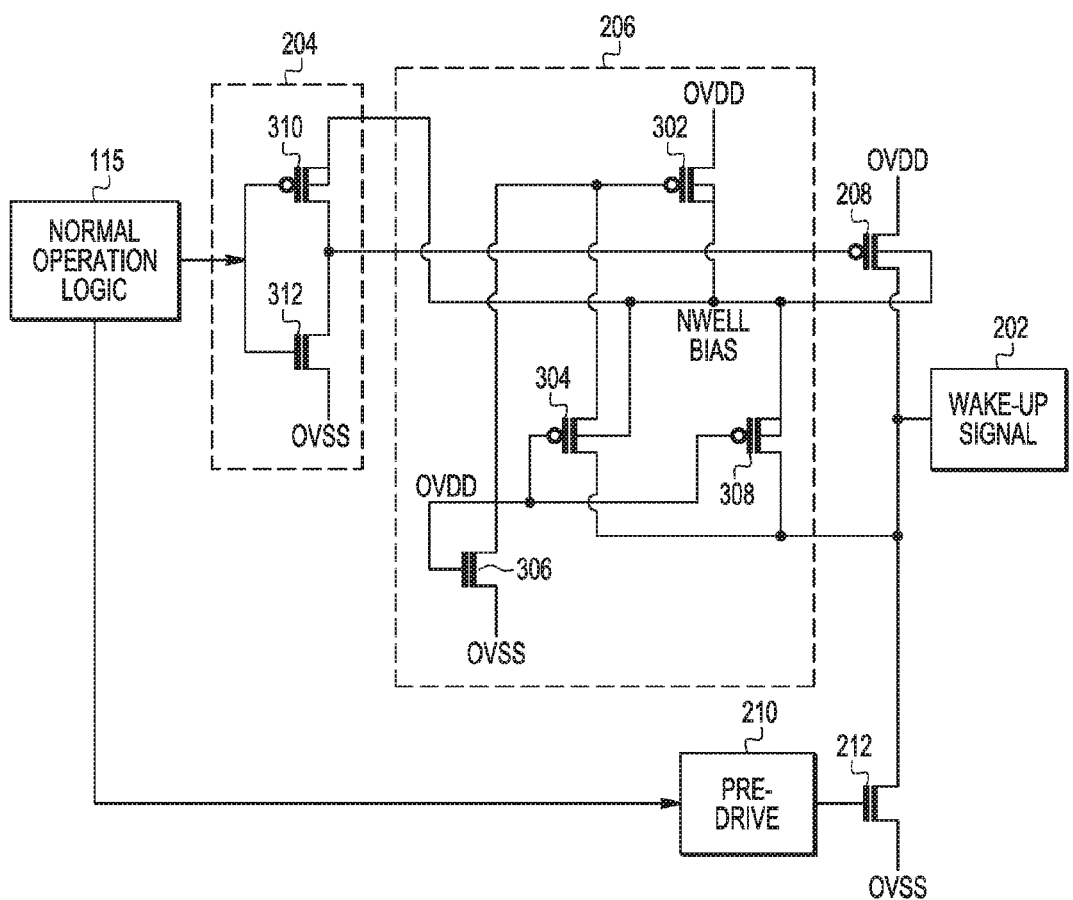
FIG. 3 is a schematic diagram illustrating an embodiment of auto-switch circuit that can be used in the microprocessor system of FIG. 1.

FIG. 3 is a schematic diagram illustrating an embodiment of pre-drive circuit 204 and auto-switch circuit 206 that can be used in the microprocessor system 100 of FIG. 1. Pre-drive circuit 204 includes a P-channel transistor 310 and N-channel transistor 312. A drain electrode of P-channel transistor 310 is coupled to a drain electrode of N-channel transistor 312. Gate electrodes of transistors 310, 312 are coupled to an output of normal operation logic 115. A source electrode and N-well of P-channel transistor 310 are connected to the N-well of P-channel transistor 208. A source electrode of N-channel transistor 312 is coupled to ground voltage OVSS. Pre-drive circuit 210 can be implemented with a P-channel and N-channel transistor similar to pre-drive circuit 204.

Auto switch circuit 206 includes P-channel transistors 302, 304, 308 and N-channel transistor 306. P-channel transistor 302 includes a gate electrode coupled to a drain electrode of N-channel transistor 306, a source electrode coupled to supply voltage OVDD, and a drain electrode and an N-well coupled between the source electrode and N-well of P-channel transistor 310 and the N-well of P-channel transistor 208.

P-channel transistor 304 has a gate electrode coupled between a gate electrode of N-channel transistor 306 and a gate electrode of P-channel transistor 308. A drain electrode of P-channel transistor 304 is coupled between the gate electrode of P-channel transistor 302 and the drain electrode of N-channel transistor 306. An N-well of P-channel transistor 304 is coupled between the source electrode and N-well of P-channel transistor 310 and the N-well of P-channel transistor 208. A source electrode of P-channel transistor 304 is coupled between the source electrode of P-channel transistor 208 and a drain electrode of N-channel transistor 212.

P-channel transistor 308 has a gate electrode coupled to the gate electrode of N-channel transistor 306. A drain electrode and an N-well of P-channel transistor 308 is coupled between the source electrode and N-well of P-channel transistor 310 and the N-well of P-channel transistor 208. A source electrode of P-channel transistor 308 is coupled between the source electrode of P-channel transistor 304 and the drain of P-channel transistor 208.

During operation in low power mode, supply voltage OVDD is zero. The input to the gate electrode of P-channel transistor 208 from pre-drive circuit 204 is set high to place P-channel transistor 208 in non-conducting mode. P-channel transistors 304 and 308 are in conducting mode and the voltage on I/O pad 202 is coupled to the N-well of P-channel transistor 208 through P-channel transistor 308. The N-wells of P-channel transistors 310, 302, 304, 308 and 208 are tied together to prevent leakage in P-channel transistors 310, 302, 304, 308 and 208.

Without a bias on the N-well of P-channel transistor 208, leakage current would occur due to P-channel transistor 208 being in a conducting mode and a parasitic diode of the N-well of P-channel transistor 208. In contrast, leakage current in P-channel transistor 208 is prevented by biasing the N-well of P-channel transistor 208 to the voltage at I/O pad 202.

Figure 4:
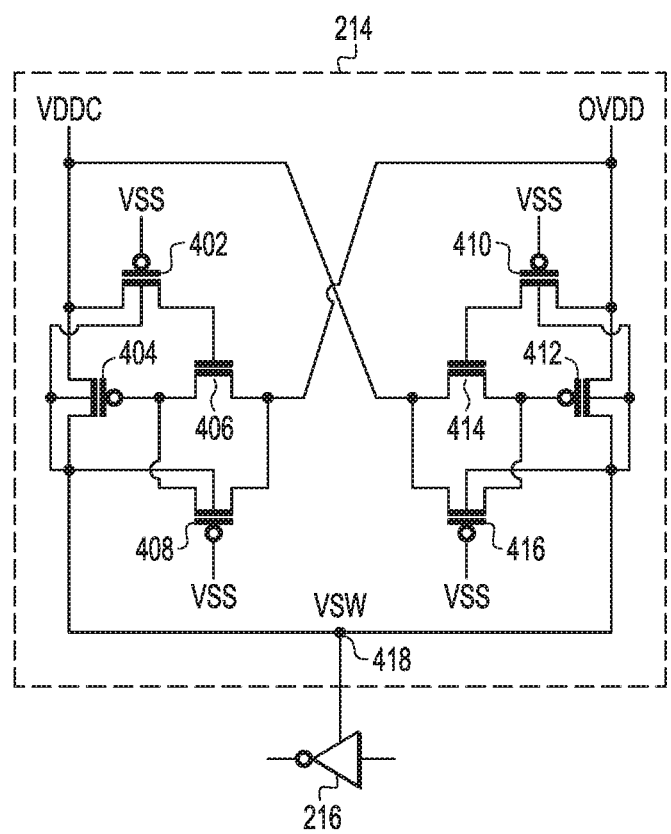
FIG. 4 is a schematic diagram illustrating an embodiment of a second auto-switch circuit that can be used in the microprocessor system of FIG. 1.

FIG. 4 is a schematic diagram illustrating an embodiment of auto-switch circuit 214 that can be used in the microprocessor system 100 of FIG. 1. Auto-switch circuit 214 includes P-channel transistors 402, 404, 408, 410, 412, 416 and N-channel transistors 406 and 414. Auto-switch circuit 214 is coupled to receive constant supply voltage VDDC and supply voltage OVDD, and to output a control signal VSW to inverter 216 at output node 418.

P-channel transistor 402 has a gate electrode coupled to ground voltage VSS, a source electrode coupled to constant supply voltage VDDC, and a drain electrode coupled to a gate electrode of N-channel transistor 406. P-channel transistor 404 has a source electrode coupled to constant supply voltage VDDC, and a drain electrode coupled to output node 418. N-channel transistor 406 has a gate electrode coupled to the drain electrode of P-channel transistor 402, a source electrode coupled to the gate electrode of P-channel transistor 404 and a drain electrode coupled to supply voltage OVDD. P-channel transistor 408 has a gate electrode coupled to ground voltage VSS, a drain electrode coupled to the source electrode of N-channel transistor 406, and a source electrode coupled to the drain electrode of N-channel transistor 406. The N-wells of P-channel transistors 402, 404, and 408 are coupled to one another and to output node 418.

P-channel transistor 410 has a gate electrode coupled to ground voltage VSS, a source electrode coupled to supply voltage OVDD, and a drain electrode coupled to a gate electrode of N-channel transistor 414. P-channel transistor 412 has a source electrode coupled to supply voltage OVDD, and a drain electrode coupled to output node 418. N-channel transistor 414 has a gate electrode coupled to the drain electrode of P-channel transistor 410, a source electrode coupled to the gate electrode of P-channel transistor 412 and a drain electrode coupled to constant supply voltage VDDC. P-channel transistor 416 has a gate electrode coupled to ground voltage VSS, a drain electrode coupled to the source electrode of N-channel transistor 414, and a source electrode coupled to the drain electrode of N-channel transistor 414. The N-wells of P-channel transistors 410, 412, and 416 are coupled to one another and to output node 418.

Auto switch 214 provides a robust power switch with N-channel transistors 406, 414 and respective P-channel transistors 402, 408, 410, 416 form protection switches that provide cross-domain electro-static discharge (ESD) protection for the input portion of I/O circuit 120 (FIG. 1). In normal operation, the auto switch 214 couples supply voltage OVDD to inverter 216, and in power down mode, auto switch 214 couples constant supply voltage VDDC to inverter 216. The robust ESD protection embedded in I/O circuit 120 allows I/O circuit 120 to be placed anywhere in the I/O pad ring. Additionally, the space required to implement I/O circuit 120 is no greater than the space already used to implement conventional I/O circuits, and I/O circuit 120 uses the same bus as conventional I/O circuits.

By now it is apparent that in some embodiments there has been provided an integrated circuit (102) that can include an input/output pad, an input circuit (214, 216, 218) coupled to the input/output pad (202) that receives input signals including a wake-up signal that indicates when the integrated circuit is to switch from a power-down mode to an active mode, and an output circuit (204, 206, 210) coupled to the input/output pad that provides output signals to the input/output pad. The output circuit can further comprise a first P channel transistor (208) in a well having a drain coupled to the input/output pad, and a source coupled to a power supply terminal (OVDD) that receives a first power supply voltage during the active mode and is decoupled from any power supply during the power-down mode. The well can be coupled to the wake-up signal in response to the wake-up signal indicating a change from the power-down mode to the active mode.

In another aspect, the integrated circuit can further comprise an input (118) for receiving a continuous voltage (VDDC) that is intended to be present during the power-down mode. The continuous voltage can be coupled to the input circuit during the power-down mode and the active mode.

In another aspect, the output circuit can further comprise a coupling circuit (308) that couples the input/output pad to the well during the power-down mode.

In another aspect, the output circuit can further comprise a second P channel transistor (308) having a source coupled to the input/output pad, a drain coupled to the well, and a gate coupled to the power supply terminal.

In another aspect, the power supply terminal can be coupled to ground during the power-down mode.

In another aspect, the output circuit can further comprise a third P channel transistor (302) having a source connected to the power supply terminal, a drain connected to the well, and a gate configured to keep the third transistor non-conductive during the power-down mode and conductive during the active mode.

In another aspect, the output circuit can further comprise a first N channel transistor (306) having a gate coupled to the power supply terminal, source coupled to ground, and drain connected to the gate of the third P channel transistor.

In another aspect, the output circuit can further comprise a fourth P channel transistor (304) having a gate coupled to the power supply terminal, a drain coupled to the gate of the third P channel transistor, and a source coupled to the input/output terminal.

In another aspect, the output circuit can further comprise an auto switch (206) having input for receiving a logic signal and an output coupled to the gate of the first P channel transistor.

In another aspect, the output circuit can further comprise an inverter (204) receiving power through the third P channel transistor.

In another aspect, the output circuit can further comprise a logic circuit (115) coupled to the output circuit.

In another embodiment, a method of operating an input/output circuit (206) of an integrated circuit (102) coupled to an input/output pad (202) of the integrated circuit and having a power-down mode and an active mode can comprise supplying power to a first node (OVDD) during the active mode and removing power from the first node in response to switching from the active mode to the power-down mode, coupling the first node to a well of a first P channel transistor (208) having a drain coupled to the input/output pad during the active mode, and coupling the input/output pad to the well during the power-down mode.

In another aspect, the coupling the input/output pad to the well can be further characterized by using a second P channel transistor (308) coupled between the input/output pad and the well and having a gate coupled to the first node.

In another aspect, the coupling the first node to the well can be further characterized by using a third P channel transistor (302) coupled between the well and the first node and causing the third P channel transistor to be conductive during the active mode.

In another aspect, the causing the third P channel transistor to be conductive during the active mode can comprise coupling the gate of the third P channel transistor to ground during the active mode.

In another aspect, the coupling the gate of the third P channel transistor to ground during the active mode can comprise using an N channel transistor (306) coupled between ground and the gate of the third transistor and causing the N channel transistor to be conductive when the first node receives power.

In another aspect, the method can further comprise providing an output to the input/output pad by coupling an output signal to a gate of the first P channel transistor during the active mode.

In another aspect, the coupling the input/output pad to the well during the power-down mode can be further characterized as coupling a wake-up signal received at the input/output pad to the well during the power-down mode.

In another aspect, an integrated circuit (102) including a power-down mode, an active mode, and an input/output pad (202) for use in transferring data under the control of a central processing unit (106) and for detecting a wake-up signal that directs the integrated circuit to switch from the power-down mode to the active mode, can comprise an input circuit (214, 216, 218) coupled to the input/output pad that receives input signals including the wake-up signal, and an output circuit having a first P channel transistor (208) having a drain connected to the input/output circuit, a well, a gate, and a source coupled to a power supply terminal (OVDD) that provides power during the active mode and no power during the power-down mode. The well can be coupled to the power supply terminal during the active mode and to the input/output node during the power-down mode.

In another aspect, the power supply terminal can be grounded during the power-down mode and the wake-up signal can be coupled to the well during the power-down mode.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Some of the above embodiments, as applicable, may be implemented using a variety of different information processing systems. For example, although FIG. 7 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
an input/output pad;
an input circuit coupled to the input/output pad that receives input signals including a wake-up signal that indicates when the integrated circuit is to switch from a power-down mode to an active mode; and
an output circuit coupled to the input/output pad that provides output signals to the input/output pad, wherein the output circuit comprises a first P channel transistor in a well having a drain coupled to the input/output pad, and a source coupled to a power supply terminal that receives a first power supply voltage during the active mode and is decoupled from any power supply during the power-down mode, wherein the well is coupled to the wake-up signal in response to the wake-up signal indicating a change from the power-down mode to the active mode.

2. The integrated circuit of claim 1, wherein the integrated circuit further comprises an input for receiving a continuous voltage that is intended to be present during the power-down mode, wherein the continuous voltage is coupled to the input circuit during the power-down mode and the active mode.

3. The integrated circuit of claim 1, wherein the output circuit further comprises a coupling circuit that couples the input/output pad to the well during the power-down mode.

4. The integrated circuit of claim 1, wherein the output circuit further comprises a second P channel transistor having a source coupled to the input/output pad, a drain coupled to the well, and a gate coupled to the power supply terminal.

5. The integrated circuit of claim 4, wherein the power supply terminal is coupled to ground during the power-down mode.

6. The integrated circuit of claim 5, wherein the output circuit further comprises a third P channel transistor having a source connected to the power supply terminal, a drain connected to the well, and a gate configured to keep the third transistor non-conductive during the power-down mode and conductive during the active mode.

7. The integrated circuit of claim 6, wherein the output circuit further comprises a first N channel transistor having a gate coupled to the power supply terminal, source coupled to ground, and drain connected to the gate of the third P channel transistor.

8. The integrated circuit of claim 7 wherein the output circuit further comprises a fourth P channel transistor having a gate coupled to the power supply terminal, a drain coupled to the gate of the third P channel transistor, and a source coupled to the input/output terminal.

9. The integrated circuit of claim 8, wherein the output circuit further comprises an auto switch having input for receiving a logic signal and an output coupled to the gate of the first P channel transistor.

10. The integrated circuit of claim 6, wherein the output circuit further comprises an inverter receiving power through the third P channel transistor.

11. The integrated circuit of claim 1, further comprising a logic circuit coupled to the output circuit.

12. A method of operating an input/output circuit of an integrated circuit coupled to an input/output pad of the integrated circuit and having a power-down mode and an active mode, comprising:
supplying power to a first node during the active mode and removing power from the first node in response to switching from the active mode to the power-down mode;
coupling the first node to a well of a first P channel transistor having a drain coupled to the input/output pad during transition from the power-down mode to the active mode; and
coupling the input/output pad to the well during the power-down mode.

13. The method of claim 12 wherein the coupling the input/output pad to the well is further characterized by using a second P channel transistor coupled between the input/output pad and the well and having a gate coupled to the first node.

14. A method claim 13, wherein the coupling the first node to the well is further characterized by using a third P channel transistor coupled between the well and the first node and causing the third P channel transistor to be conductive during the active mode.

15. The method of claim 14, wherein the causing the third P channel transistor to be conductive during the active mode comprises coupling the gate of the third P channel transistor to ground during the active mode.

16. The method of claim 15, wherein the coupling the gate of the third P channel transistor to ground during the active mode comprises using an N channel transistor coupled between ground and the gate of the third transistor and causing the N channel transistor to be conductive when the first node receives power.

17. The method of claim 16 further comprising providing an output to the input/output pad by coupling an output signal to a gate of the first P channel transistor during the active mode.

18. The method of claim 12, wherein the coupling the input/output pad to the well during the power-down mode is further characterized as coupling a wake-up signal received at the input/output pad to the well during the power-down mode.

19. An integrated circuit having a power-down mode, an active mode, and an input/output pad for use in transferring data under the control of a central processing unit and for detecting a wake-up signal that directs the integrated circuit to switch from the power-down mode to the active mode, comprising;
an input circuit coupled to the input/output pad that receives input signals including the wake-up signal; and
an output circuit having a first P channel transistor (208) having a drain connected to the input/output circuit, a well, a gate, and a source coupled to a power supply terminal (OVDD) that provides power during the active mode and no power during the power-down mode, wherein the well is coupled to the power supply terminal during the active mode and to the input/output node during transition from the power-down mode to the active mode.

20. The integrated circuit of claim 19, wherein the power supply terminal is grounded during the power-down mode and the wake-up signal is coupled to the well during the power-down mode.

* * * * *